(12) United States Patent
Evans, III et al.

(10) Patent No.: US 9,255,343 B2
(45) Date of Patent: Feb. 9, 2016

(54) IRON-BASED COMPOSITION FOR MAGNETOCALORIC EFFECT (MCE) APPLICATIONS AND METHOD OF MAKING A SINGLE CRYSTAL

(71) Applicant: UT-Battelle, LLC, Oak Ridge, TN (US)

(72) Inventors: Boyd Mccutchen Evans, III, Oak Ridge, TN (US); Roger A. Kisner, Knoxville, TN (US); Gail Mackiewicz Ludtka, Oak Ridge, TN (US); Gerard Michael Ludtka, Oak Ridge, TN (US); Alexander M. Melin, Knoxville, TN (US); Donald M. Nicholson, Oak Ridge, TN (US); Chad M. Parish, Knoxville, TN (US); Orlando Rios, Knoxville, TN (US); Athena S. Sefat, Oak Ridge, TN (US); David L. West, Oak Ridge, TN (US); John B. Wilgen, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 468 days.

(21) Appl. No.: 13/790,560

(22) Filed: Mar. 8, 2013

(65) Prior Publication Data

US 2014/0251506 A1 Sep. 11, 2014

(51) Int. Cl.
*C30B 11/00* (2006.01)
*H01F 1/01* (2006.01)
*C22C 38/06* (2006.01)
(Continued)

(52) U.S. Cl.
CPC ............... *C30B 11/003* (2013.01); *C30B 11/02* (2013.01); *C30B 29/52* (2013.01); *C30B 30/04* (2013.01); *H01F 1/015* (2013.01)

(58) Field of Classification Search
CPC ...... C30B 11/003; C30B 29/52; C30B 30/04; H01F 1/015; H01F 1/047; C22C 38/06; C22C 38/08; C22C 38/105
USPC .......... 149/310, 315, 108; 420/80; 117/32, 73
See application file for complete search history.

(56) References Cited

U.S. PATENT DOCUMENTS 5,168,096 A * 12/1992 Tournier ..................... 117/79
5,521,148 A * 5/1996 Torii et al. ................. 505/120
(Continued)

FOREIGN PATENT DOCUMENTS

| CN | 101974707 A | 2/2011 |
| JP | 2009-235454 A | 10/2009 |
| JP | 2011-042852 A | 3/2011 |

OTHER PUBLICATIONS

P. de Rango et al.; "Texturing of Magnetic Materials at High Temperature by Solidification in a Magnetic Field"; Nature vol. 349; pp. 770-772; Feb. 1991.*

(Continued)

*Primary Examiner* — Helene Klemanski
(74) *Attorney, Agent, or Firm* — Brinks Gilson & Lione

(57) ABSTRACT

A method of making a single crystal comprises heating a material comprising magnetic anisotropy to a temperature T sufficient to form a melt of the material. A magnetic field of at least about 1 Tesla is applied to the melt at the temperature T, where a magnetic free energy difference $\Delta G_m$ between different crystallographic axes is greater than a thermal energy kT. While applying the magnetic field, the melt is cooled at a rate of about 30° C./min or higher, and the melt solidifies to form a single crystal of the material.

18 Claims, 16 Drawing Sheets

(51) Int. Cl.
    *C22C 38/08*    (2006.01)
    *C22C 38/10*    (2006.01)
    *C30B 11/02*    (2006.01)
    *C30B 29/52*    (2006.01)
    *C30B 30/04*    (2006.01)

(56) References Cited

U.S. PATENT DOCUMENTS

| | | | | |
|---|---|---|---|---|
| 5,529,981 | A * | 6/1996 | Holloway | 505/400 |
| 6,767,848 | B2 | 7/2004 | Tachikawa et al. | 438/775 |
| 7,161,124 | B2 * | 1/2007 | Kisner et al. | 219/635 |
| 7,594,966 | B2 | 9/2009 | Hoshi et al. | 117/89 |
| 8,016,952 | B2 | 9/2011 | Ishida et al. | 148/312 |
| 8,083,990 | B2 * | 12/2011 | Ishida et al. | 420/80 |
| 8,522,562 | B2 * | 9/2013 | Ludtka et al. | 62/3.1 |
| 2003/0062097 | A1 * | 4/2003 | Shimada et al. | 148/101 |
| 2006/0144048 | A1 | 7/2006 | Schulz | 60/641.8 |
| 2010/0107968 | A1 | 5/2010 | Vaabengaard et al. | 117/52 |
| 2010/0170432 | A1 | 7/2010 | Furukawa | 117/208 |
| 2011/0041513 | A1 | 2/2011 | Reesink | 62/3.1 |

OTHER PUBLICATIONS

Y. Tanaka et al.; "Ferrous Polycrystalline Shape-Memory Alloy Showing Huge Superelasticity"; Science vol. 327; pp. 1488-1490; Mar. 2010.*

Ammon, et al., "Application of Magnetic Fields in Industrial Growth of Silicon Single Crystals," *The 15$^{th}$ Riga and 6$^{th}$ PAMIR Conference on Fundamental and Applied MHD*, (2005) pp. 41-54.

Cröll, A. et al., "The Influence of Static and Rotating Magnetic Fields on Heat and Mass it Transfer in Silicon Floating Zones," *J. Electrochem. Soc.*, 146, 6 (1999)—Abstract Only.

Ganapathysubramanian, B. et al., "Using Magnetic Field Gradients to Control the Directional Solidification of Alloys and the Growth of Single Crystals," *Journal of Crystal Growth*, 270 (2004) pp. 255-272.

Polo-Gomez, C. et al., "Magnetocaloric Effect in FeCr Soft Magnetic Nanocrystalline Alloys," *Journal of Magnetism and Magnetic Materials*, 316 2 (2007) pp. e876-e878.

Series, R.W. et al., "The Use of Magnetic Fields in Semiconductor Crystal Growth," *Journal of Crystal Growth*, 113 (1991) pp. 305-328.

Tanaka, Y. et al., "Ferrous Polycrystalline Shape-Memory Alloy Showing Huge Superelasticity," *Science*, 327 (2010) pp. 1488-1490.

* cited by examiner

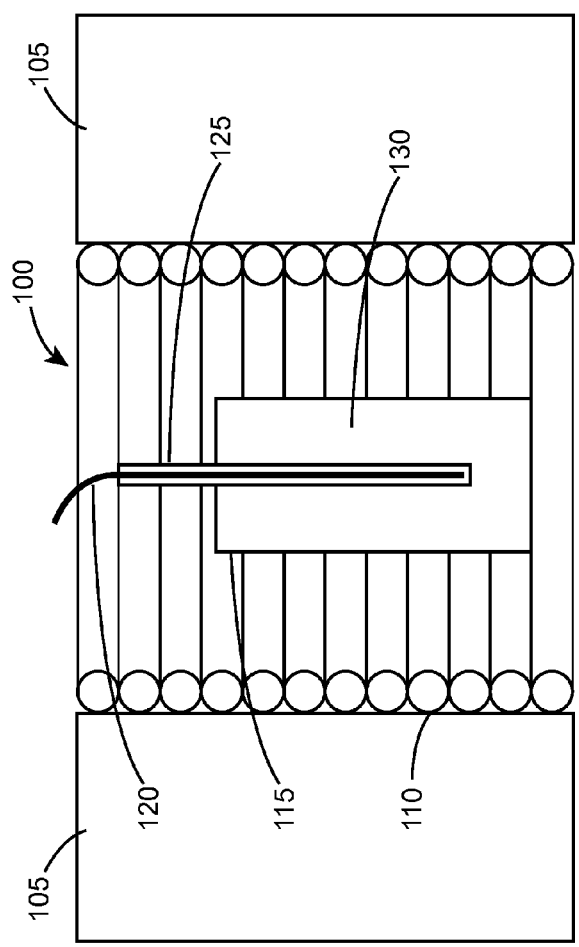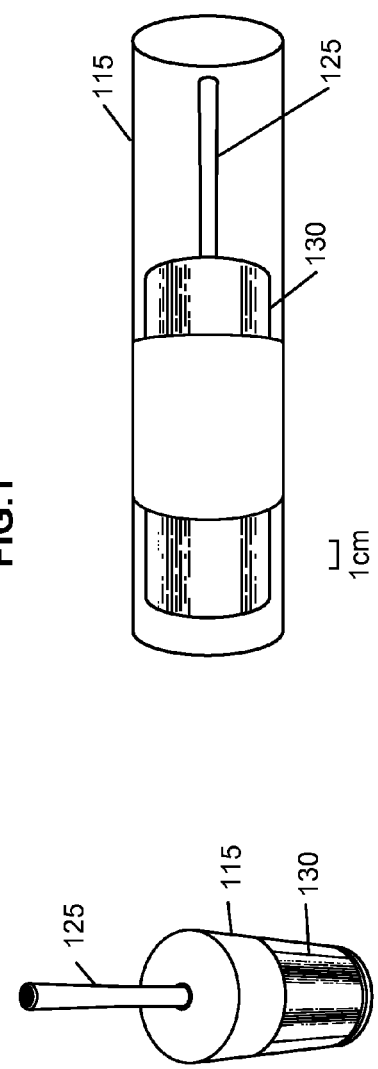

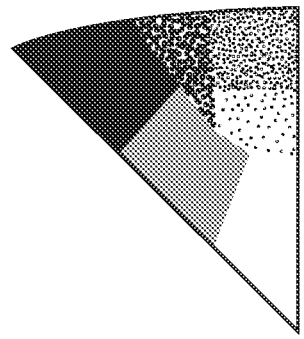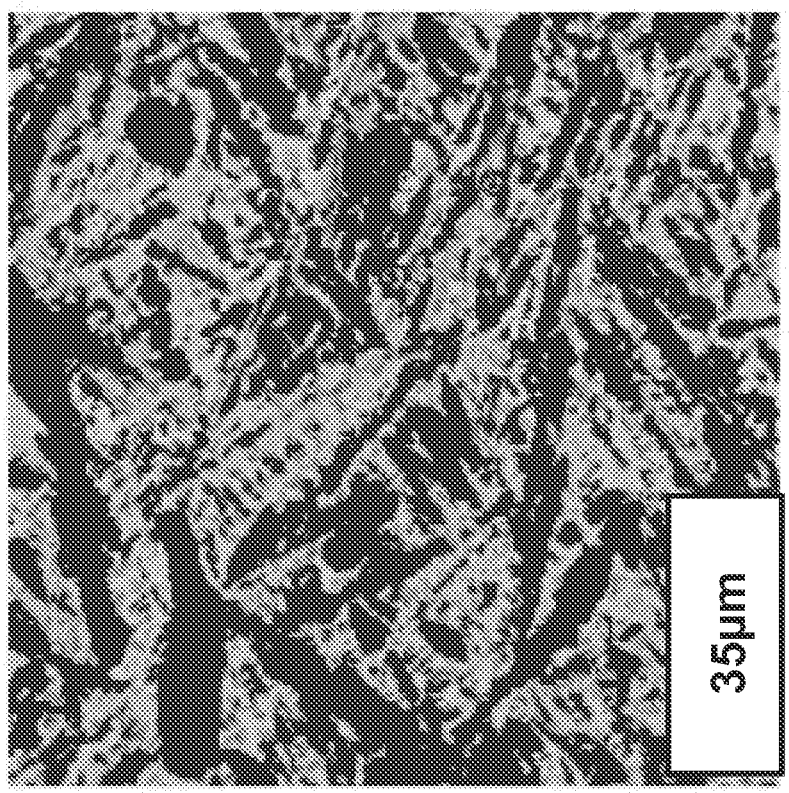
Fig. 5

US 9,255,343 B2

IRON-BASED COMPOSITION FOR MAGNETOCALORIC EFFECT (MCE) APPLICATIONS AND METHOD OF MAKING A SINGLE CRYSTAL

FEDERALLY SPONSORED RESEARCH OR DEVELOPMENT

This invention was made with government support under Contract No. DE-AC05-00OR22725 awarded by the U.S. Department of Energy. The government has certain rights in the invention.

TECHNICAL FIELD

The present disclosure is related generally to magnetic materials and magnetic processing, and more particularly to a magnetic field-assisted method of forming a single crystalline material.

BACKGROUND

Single crystalline materials (both pure and alloyed) may exhibit unique mechanical, electrical, and optical properties. For metallic single crystals, high strength and resistance to creep are demonstrated, which is important for turbine blades. Single crystalline copper and aluminum exhibit better electrical conductivity, which makes possible reduced parasitic heating in electrical power transmission and motors.

In addition to metals, other materials are grown as single crystals for a variety of applications, including radiation detectors, semiconductor electronics, and optical devices. Conventional methods of producing single crystals generally require slow solidification rates and tightly controlled thermal gradients, which lead to energy intensive and costly manufacturing processes. For example, a single finished five-inch semiconductor grade single-crystal silicon wafer can cost thousands of dollars, and a single-crystal turbine blade can cost upwards of $10K. Much of the cost associated with these components is linked to the processing time and energy associated with manufacturing.

Several methods are currently used to produce high purity semiconductor crystals, including float zone melting, the Czochralski process, and the Bridgman and Stockbarger techniques, while other crystal growth methods may be employed for lower purity applications. In addition to crystal growth, purification steps such as zone refining, in which a narrow region of a crystal is melted and moved along the crystal length, are employed to concentrate impurities at one end of the ingot, leaving the bulk purer after each pass. All of these methods require significant time for the growth to take place—several days to weeks—due to the kinetics at the solidification interface.

An area of materials technology that may benefit from further development of single crystal growth processes is magnetocaloric materials. The magnetocaloric effect (MCE) is based on the change in entropy that occurs with magnetic domain alignment as ferromagnetic materials approach their Curie temperature or as paramagnetic materials are magnetized and demagnetized. The MCE is exhibited as a reversible change in temperature of a ferromagnetic material upon the application or removal of a magnetic field. Advanced magnetocaloric alloys based on earth-abundant non-toxic elements are needed to meet the demands of commercial heating and cooling systems. The classic MCE may be greatly enhanced when the Curie temperature is coupled with a structural transition (magnetostructural coupling), and the cooling effect from the structural transformation may be several times that from the magnetic transformation, and are said to exhibit "giant MCE." Advanced materials are desired that exhibit large magnetostructural coupling effects and large changes in entropy near ambient temperatures at modest fields of 1-2 Tesla. Refrigeration systems based on the magnetocaloric effect have the potential for improvements of 60-100% in performance over conventional gas compression systems.

For a giant MCE, the structural transition is most commonly a martensitic shear transformation with an associated shape change. As a result, there can be severe transformational stresses that need to be accommodated along the habit plain between the parent and shear phases. There is a threshold defined by the mechanical properties of the alloy above which the transformational stresses are accommodated irreversibly (inelastically) and cannot be used in a refrigeration cycle. Texturing of a material can be an effective method of facilitating the accommodation of these stress, thereby lowering the activation energy for the transformation. This may be accomplished by aligning the structural domains along low energy boundaries such that the direction perpendicular to the habit planes is nearly parallel, as in a single crystal or highly textured material. Improved performance of single crystals in magnetic refrigeration applications has been demonstrated (e.g., Kimura, H., Numazawa, T., Sato, M., Ikeya, T., Fukuda, T., and Fujioka, K., "Single crystals of $RAlO_3$ (R: Dy, Ho and Er) for use in magnetic refrigeration between 4.2 and 20 K," *Journal of Materials Science*, vol. 32, pp. 5743-5747, 1997). However, powders may be synthesized with a particle size distribution that is less than the characteristic domain size of the MCE material, essentially making single crystal particles. In addition, extensive thermomechanical processing may be employed to produce a high degree of deformation texture. However, both of these methods result in structural alignment that is less perfect than what is found in a single crystal. In short, various industrial applications, ranging from magnetocaloric devices to semiconductor chips, could benefit from the development of an economical process for fabricating single crystal materials.

BRIEF SUMMARY

An improved method of making single crystals based on thermomagnetic processing is described herein. Also described is an iron-based composition suitable for magnetocaloric effect (MCE) applications.

The method of making a single crystal comprises heating a material comprising magnetic anisotropy to a temperature T sufficient to form a melt of the material. A magnetic field of at least about 1 Tesla is applied to the melt at the temperature T, where a magnetic free energy difference $\Delta G_m$ between different crystallographic axes is greater than a thermal energy kT. While applying the magnetic field, the melt is cooled at a rate of about 30° C./min or higher, and the melt solidifies to form a single crystal of the material. The magnetic anisotropy may comprise one or both of magnetocrystalline anisotropy and magnetic shape anisotropy.

The iron-based composition for magnetocaloric effect (MCE) applications comprises: 25-30 wt. % Ni, 14-20 wt. % Co, 9-13 wt. % Al, up to about 3 wt. % Ta, up to about 0.07 wt. % B; and the balance Fe, wherein the iron-based composition comprises a crystallite density of no more than about 1 grain/$mm^2$.

BRIEF DESCRIPTION OF THE DRAWINGS

FIG. 1 shows an exemplary thermomagnetic processing apparatus suitable for batch heating and solidification.

FIGS. 2A-2B show an exemplary crucible for containing the material to be thermomagnetically processed.

FIG. 5 shows an electron backscatter diffraction (EBSD) image of the rapidly cooled sample of Example 1. Note that the monochrome display indicates that a single crystal orientation is present in the sample.

FIG. 6B was obtained from a central location of the sample (which is about 1 cm in diameter), and FIGS. 6A and 6C were obtained from locations closer to the sample edge.

FIG. 6E is from a central location and FIGS. 6D, 6F and 6G are from locations closer to the sample edge.

DETAILED DESCRIPTION

Figure 3:
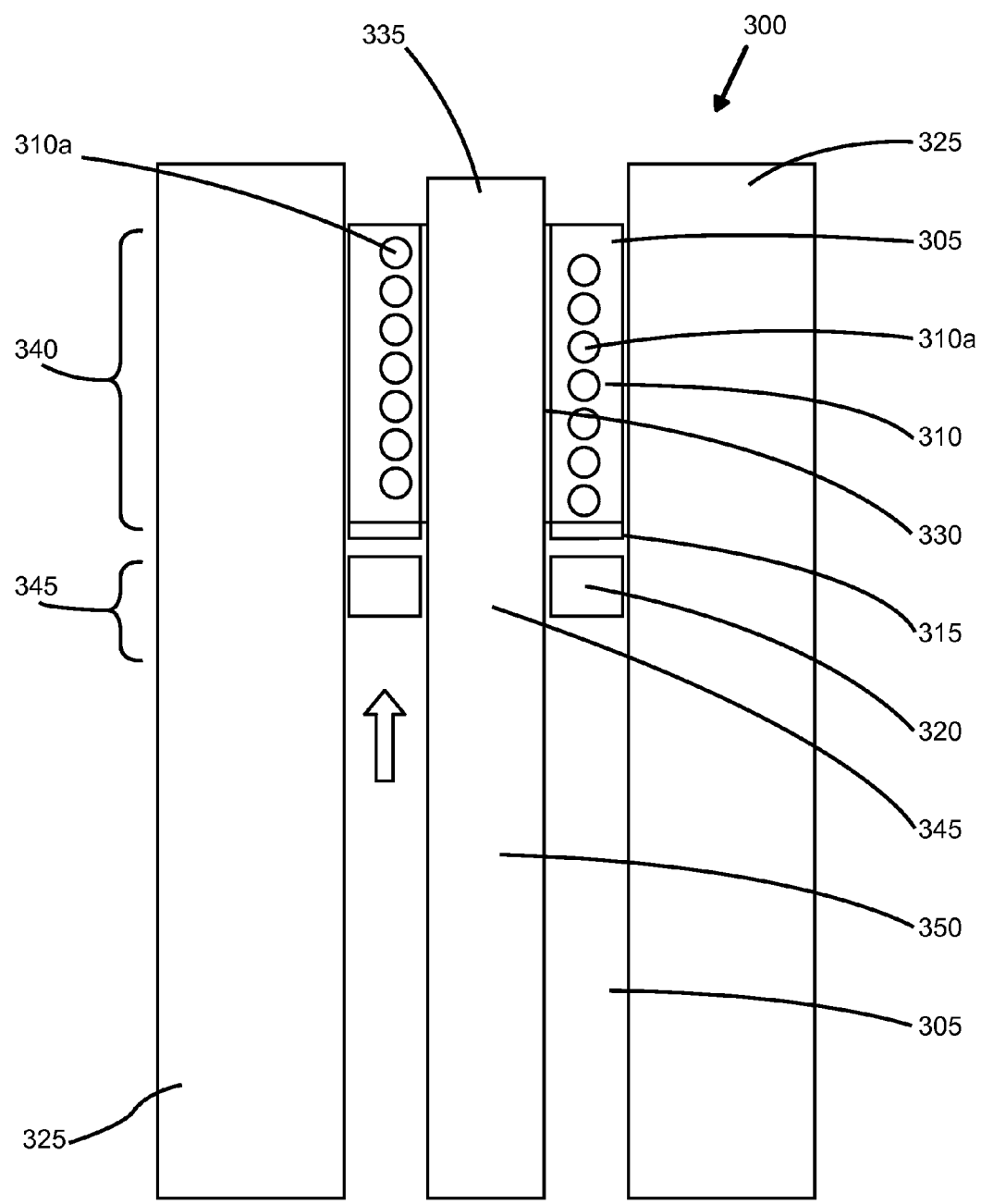
FIG. 3 shows an exemplary thermomagnetic processing apparatus suitable for continuous heating and solidification.

A unique high magnetic field processing method that yields single crystals and/or near perfect texturing (very small misorientations) between crystalline grains upon cooling from the melt has been developed. The method, which combines high magnetic fields with rapid cooling rates in excess of 30° C./min, can be used to prepare large-size single crystals from a variety of materials. The high magnetic field processing method favors crystallographic and/or morphological alignment while controlling convection and nucleation uniformly throughout the material. The seed crystals and/or slow pulling rates employed in conventional single crystal growth processes are not required. Cooling rates of the magnitude described in this disclosure have not been achieved previously in the formation of large single crystalline materials.

By applying an ultrahigh magnetic field during cooling of a material, atomic spins in the material are influenced to locate to a preferred orientation—a kind of epitaxy overlay that penetrates the entire solidification volume. The net result is a strong force that determines the crystal orientation and overcomes slower kinetic forces, thereby enabling faster solidification than current crystal growth methods. The method is applicable to materials that exhibit anisotropic magnetic properties, such as magnetocrystalline anisotropy or magnetic shape anisotropy.

In a material having magnetocrystalline anisotropy, the magnetic susceptibility of the material in one crystallographic direction is different from the magnetic susceptibility in another crystallographic direction. In other words, the material has a first magnetic susceptibility along a first crystallographic axis and a second magnetic susceptibility along a second crystallographic axis. For example, in the case of a material with a hexagonal crystal structure, the magnetic susceptibility $\chi_c$ along the c-axis may be different from the magnetic susceptibility $\chi_a$ along the a-axis. This may be expressed as $\chi_c-\chi_a \neq 0$, where $\chi_c-\chi_a$ defines the magnetic anisotropy. If $\chi_c-\chi_a$ is greater than zero, then the c-axis may be referred to as the "easy axis" of magnetization. As would be recognized by one of ordinary skill in the art, the magnetic susceptibility of a material can be determined by measurement.

Volumetric magnetic susceptibility may be determined by the force change sensed in the presence of a magnetic field gradient, for example using the Gouy method where the mass change in a sample is measured due to the applied magnetic field (H) while balanced between two magnetic poles. A more accurate method for measuring magnetic susceptibility is the use of a quantum design superconducting quantum interference device (SQUID) magnetometer. First, a static field is established by charging a superconducting magnet. Then the change in magnetic flux due to the presence of a sample is measured by the change in voltage, and an accurate measure of the magnetic moment (in emu units) may be obtained.

The magnetic susceptibility of most crystals is not represented by a scalar value. Rather, the magnetic response depends on the sample orientation, which can occur in different crystallographic directions for a non-cubic crystal. When a material is exposed to a magnetic field (H), a field produced inside the sample (B) is B=H+4πI, where I is the induced magnetization, and I/H is the magnetic susceptibility per unit volume. In order to relate to atomic properties, the conversion to molar susceptibility ($\chi$) is important by using the mass and molar mass of a substance.

In a material having magnetic shape anisotropy, the anisotropic (e.g., non-spherical) shape of the body or particle creates an easy axis of magnetization. For example, acicular (needle-like) iron particles have magnetic shape anisotropy, where the long axis corresponds to the easy axis.

To carry out the method, the material comprising magnetic anisotropy is heated to a temperature T sufficient to form a melt of the material. The magnetic anisotropy may include one or both of magnetocrystalline anisotropy and magnetic shape anisotropy. A magnetic field of at least about 1 Tesla is applied to the melt at the temperature T, such that a magnetic free energy difference $\Delta G_m$ between different crystallographic axes is greater than a thermal energy kT, where k is the Boltzmann constant. This can be expressed as:

$$|\Delta G_m| = |G_m^c - G_m^{a,b}| = \left|-\frac{V(\chi_c - \chi_{a,b})}{2\mu_0}B^2\right| > kT, \quad \text{(Eq. 1)}$$

where $\chi_c-\chi_{a,b}$ represents the magnetocrystalline anisotropy of the material, or the difference between the magnetic susceptibility in the direction of the c-axis and the magnetic susceptibility in the direction of the a-axis and/or b-axis of the material, and B is the applied magnetic field. V represents the volume over which the magnetic field has stored energy and $\mu_0$ is permeability of free space (vacuum).

While applying the magnetic field, the melt is cooled at a rate of about 30° C./min or higher, and the melt solidifies to form a single crystal of the material.

The rate of cooling is typically at least about 50° C./min, and may be at least about 100° C./min, at least about 200° C./min, at least about 300° C./min, at least about 500° C./min, or at least about 800° C./min. The cooling rate is generally less than about 1000° C./min. For example, the cooling rate may range from about 100° C./min to about 800° C./min, or from about 300° C./min to about 600° C./min. Accordingly, the solidification of the melt to form a single crystal may occur at a growth rate R of at least about 0.013 m/min. A thermal gradient G for the process is estimated to be from about 1200° C./m to about 16000° C./m.

In some cases, the condition set forth by Equation 1 may be relaxed in that the magnetic free energy difference may be greater than or approximately equal to the thermal energy (e.g., $\Delta G_m \geq kT$); however, the magnetic free energy difference cannot be very much less than kT.

The magnetic field applied during cooling of the material may be a static magnetic field, and the method may further include simultaneously high frequency (10 kHz to 300 kHz) alternating current (AC) magnetic field. The AC magnetic field interacts with the conductive material at the solid/liquid interface of nanoparticles resulting in selective heating according to the Joules heating relationship (Power=(induced current)$^2$ resistance). During solidification, the presence of ordered nanoscale domains is detrimental to single crystal growth, as the domains may act as inoculants and promote heterogeneous nucleation. The AC magnetic field is concentrated by the nanoscale domains in the liquid and, as a consequence of magnetic hysteresis heating, may assist in maintaining the mean size of the domains below the critical size required for nucleation of grains. The result may be accelerated destruction of these domains by the synergistic AC and DC magnetic fields, enabling the growth of large single crystals.

The cooling of the melt may be achieved by flowing a thermally conductive gas over the melt (and the crucible containing the melt). Suitable gases include helium, argon, hydrogen and/or nitrogen, although other gases may also or alternatively be used. Helium has a thermal conductivity at 400 K of 191 mW/m·K; hydrogen has a thermal conductivity of 230 mW/m·K. However, nitrogen has a thermal conductivity of 32 mW/m·K which is only 40 percent better than argon (at 23 mW/m·K). Mixing small quantities of hydrogen in with nitrogen or argon can yield gases with slightly larger conductivities. Depending on the size of the crucible and the single crystal to be formed, the flow of gas may be adjusted to higher or lower flow rates to achieve a given cooling rate.

The magnetic field applied to the melt at the temperature T may be at least about 2 Tesla, at least about 3 Tesla, at least about 4 Tesla, at least about 5 Tesla, at least about 6 Tesla, at least about 7 Tesla, at least about 8 Tesla, at least about 9 Tesla, at least about 10 Tesla, at least about 15 Tesla, or at least about 20 Tesla. The magnetic field is typically no higher than about 30 Tesla, or no higher than about 50 Tesla. For example, the magnetic field may be from about 1 Tesla to about 30 Tesla, or from about 5 Tesla to about 20 Tesla. The magnitude of the magnetic field employed may depend in part on the magnetic anisotropy of the material (e.g., $\chi_c - \chi_a$) and the temperature T to which the material is heated to form a melt. For materials with smaller values of magnetic anisotropy and/or higher melting temperatures (which require higher values of the temperature T), higher magnetic fields may be used. For materials with larger values of magnetic anisotropy and/or more moderate melting temperatures, lower magnetic fields may be used.

To achieve the desired magnetic field, a superconducting magnet is preferred as it requires far less electrical power than a conventional electromagnet. However, as an alternative to superconducting magnets, resistance (Bitter) type or permanent magnets may be employed, assuming a configuration of permanent magnets can be found that yields suitably high magnetic fields. Hybrid magnets are also feasible in which the magnetic assembly consists of combinations of superconducting, Bitter, and/or permanent magnets.

The material may be heated to the temperature T by any of a number of heating methods known in the art, including induction heating, radiative heating (e.g., infrared or microwave heating), laser heating, or other methods. The rate of heating to the temperature T may be any desired rate and is typically from about 50° C./min to about 150° C./min.

Advantageously, solidification of the melt occurs while the magnetic field is applied thereto. The melt is contained in a crucible positioned within a bore of the magnet, which may have a longitudinal axis aligned with the vertical direction, as shown schematically in FIG. 1. The magnetic field may be applied in a direction parallel to a side or longitudinal axis of the crucible, which in this case is the vertical direction. However, other magnetic field directions (or "vectors") are possible. For example, the magnetic field vector may be perpendicular to the longitudinal axis of the crucible, or at some angle between 0 and 90 degrees with respect to the crucible axis. During solidification, the single crystal is formed with one of the crystallographic axes (the easy axis) aligned parallel to the direction of the magnetic field. In some instances, when it is difficult to achieve uniaxial alignment with the application of a uniaxial magnetic field, a rotating magnetic field may facilitate uniaxial alignment. Alternatively, the sample could be rotated in a uniaxial magnetic field at an appropriate orientation to facilitate uniaxial alignment. This arrangement may be beneficial for hexagonal or hexagonal-type crystal structures with specific magnetic susceptibility anisotropy conditions (e.g., $\chi_c < \chi_{a,b}$)

The formation of the single crystal does not require unidirectional solidification of the melt, where a planar or near-planar solid-liquid interface travels in the direction of cooling. To the contrary, as the melt is cooled in the present method, heat is extracted in a plurality of directions that may extend over a large angular range (e.g., greater than 180°). Accordingly, a planar or near-planar solid-liquid interface is not present in the melt, and the alignment of the easy axis of the single crystal does not necessarily coincide with the direction of cooling.

Large single crystals may be formed using the above-described process. For example, the single crystal may have a size of at least about 15 cm$^3$ or at least about 30 cm$^3$, and may be as large as about 100 cm$^3$. The upper limit of the size may be dictated by the volume of the magnet.

As indicated above, any material comprising anisotropic magnetic properties may be processed according to this method. The material may be ferromagnetic or paramagnetic at room temperature, and thus the single crystal prepared by this method may be a ferromagnetic or paramagnetic material. In one example, the material may be an iron alloy comprising: 25-30 wt. % Ni, 14-20 wt. % Co, 9-13 wt. % Al, up to about 3 wt. % Ta, up to about 0.07 wt. % B, with the balance being Fe. In an exemplary embodiment, the iron alloy may have the composition 28 wt. % Ni, 17 wt. % Co, 11.5 wt. % Al, 2.5 wt. % Ta, 0.05 wt. % B (with the balance being Fe). Accordingly, the single crystal that results from the method may be an iron-based alloy having a composition in the range set forth above. The iron-based alloy may be suitable for magnetocaloric or other magnetic applications.

Furthermore, the single crystal may be a perfect single crystal comprising no defects or grain boundaries, or the single crystal may be a near-perfect single crystal comprising a small fraction of defects (vacancies and/or disclocations) and/or grain boundaries (and thus grains or crystallites). For example, the solidified composition may have a grain boundary density so low as to exhibit a crystallite density of no more than about 1 grain/mm$^2$. The crystallite density may also be no more than about 0.7 grain/mm$^2$, no more than about 0.5 grain/mm$^2$, or no more than about 0.3 grain/mm$^2$. The rapid cooling achieved as the high strength magnetic field is applied is believed to enable the formation of perfect or near-perfect single crystal structures with a very low crystallite density.

The present method enables the fabrication of a magnetocaloric device based on a magnetic alloy that does not necessarily include a rare-earth element. For example, the magnetic alloy may be a Fe—Ni—Co—Al—Ta—B alloy having the composition 25-30 wt. % Ni, 14-20 wt. % Co, 9-13 wt. % Al, up to about 3 wt. % Ta, up to about 0.07 wt. % B, with the balance being Fe (and any inevitable impurities). In an exemplary embodiment, the magnetocaloric device may comprise an iron alloy of the composition 28 wt. % Ni, 17 wt. % Co, 11.5 wt. % Al, 2.5 wt. % Ta, 0.05 wt. % B, with the balance being Fe (and any inevitable impurities). It has been recognized that adding small amounts of tantalum and boron to Fe—Ni—Co—Al alloys resulted in a thermoelastic material that exhibits extreme superelasticity and strong magnetic properties. In particular, the mass susceptibility of the austenite phase of the Fe—Ni—Co—Al—Ta—B alloy is significantly higher than the susceptibilities of other rare earth-based MCE materials, as shown in Example 1, and the susceptibility of the lower temperature martensite phase of the Fe—Ni—Co—Al—Ta—B alloy is 350% greater than that of the austenite phase.

A simplified schematic of an experimental apparatus 100 suitable for implementing the magnetic field processing method described herein is shown in FIG. 1. This configuration, which includes a high strength magnet 105 and a heat source (e.g., induction coil 110), allows for heating of material 130 contained in a crucible 115 (e.g., see FIGS. 2A and 2B) in a controlled atmosphere and under high magnetic fields, following by rapid cooling. The heating may be supplied by any method, including but not limited to induction heating, infrared heating, laser heating, and/or microwave heating. Rapid cooling is effected by flowing a thermally conductive gas over the crucible 115 and the material 130. The temperature of the material 130 may be monitored using a thermocouple 120 shown inserted into the center of the crucible 115 and contained within a thermally conductive sleeve 125. The apparatus 100 shown schematically in FIG. 1 is suitable for "batch" magnetic processing of a material.

Another exemplary apparatus to permit magnetic field alignment of crystal orientation during the solidification of metals, semiconductors, and other materials is shown in FIG. 3. This apparatus 300, which is suitable for "continuous" magnetic processing of a material, may include a carriage 305 including an induction heater 310, a field shaping component 315, and a cooling zone 320 that can be moved from bottom to top of a column of the material 335 inside the bore of a magnet 325. The induction heater 310 may also have a susceptor 330 between the coils 310a and the column of material 335 depending on whether (a) the material 335 is sufficiently conductive to self-heat and (b) the high-frequency acoustic pressure pulses arising from the Lorentz force are desired. As the material 335 is melted, the carriage 305 is moved upward, and thus a melt zone 340 and re-solidification zone 345 is created that moves along with the carriage 305. The apparatus may be controlled to produce varying amounts of stirring/agitation of the melt depending on the choice of frequencies used for the induction heating current. It is possible to use multiple coils driven by separate power supplies that operate simultaneously at differing frequencies and currents so that one portion of the material 335 is heated without stirring while another part is stirred. These frequencies and currents can be controlled over the travel of the carriage 305, as shown in the figure. Ranges of operating frequencies for the induction heating range from 500 Hz for extreme stirring to hundreds of kilohertz, or even megahertz. At higher frequencies, the atomic movement due to the Lorentz forces becomes slight and no longer breaks up dendritic formations or overcomes the external magnetic alignment forces.

Rapid cooling is effected by gas flow (e.g., helium for maximum heat transfer) that may be provided by the component 320 under the induction coil assembly 310. The result is a solidified single crystal 350. A feedback controlled application of helium or other gas(es) may be provided so as to maintain a specific temperature gradient in the cooling zone 320. Furthermore, the heating and cooling zones 310, 340, 320, 345 can be stacked so as to create several heat/cool zones in series. An AC field shaping component 315 may be present to limit the AC magnetic field developed by the induction heater 310. The field shaping component 315 can be conductive retarding plates or additional coils wound in a field bucking configuration so as to shape the field gradient and rapidly attenuate the AC magnetic field a short distance from the main heating field. All of the material 335 and the carriage system 305 may be contained within the bore of the magnet 325. Other configurations are possible and may be viable. For example, the induction coil can be replaced by a radiant heat coil. Also, a susceptor can be used with the induction coil to form a radiant heater zone.

EXAMPLE

1. Synthesis and Magnetic Processing

Fe-28Ni-17Co-11.5Al-2.5Ta-0.05B alloy buttons were arc melted and drop cast, and the compositionally homogenous arc melted material was sectioned and loaded into a crucible made of a thermodynamically stable material. Thermomagnetic solidification was carried out under a 19 Tesla magnetic field using the apparatus shown schematically in FIG. 1. A fast 400° C./min cooling rate and a slow 30° C./min cooling rate were used in the magnetic processing experiment along with a no-field, slow-cooled sample.

Figure 4A:
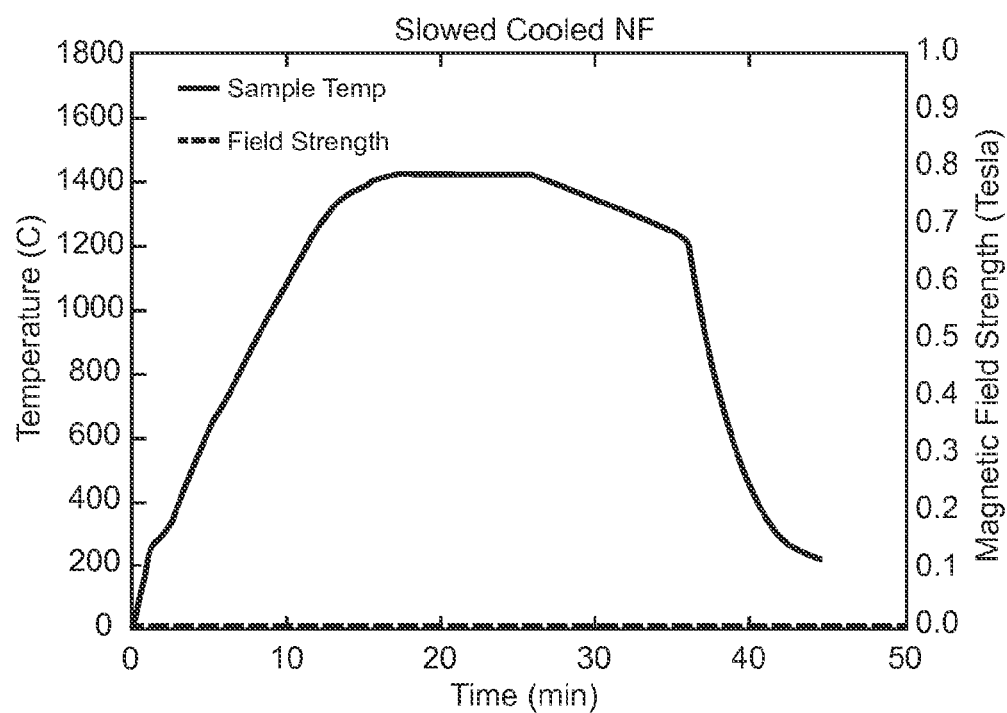
FIGS. 4A, 4C and 4E show bulk material heating and cooling profiles, as well as applied magnetic field profiles, employed in three separate experiments.
Figure 4B:
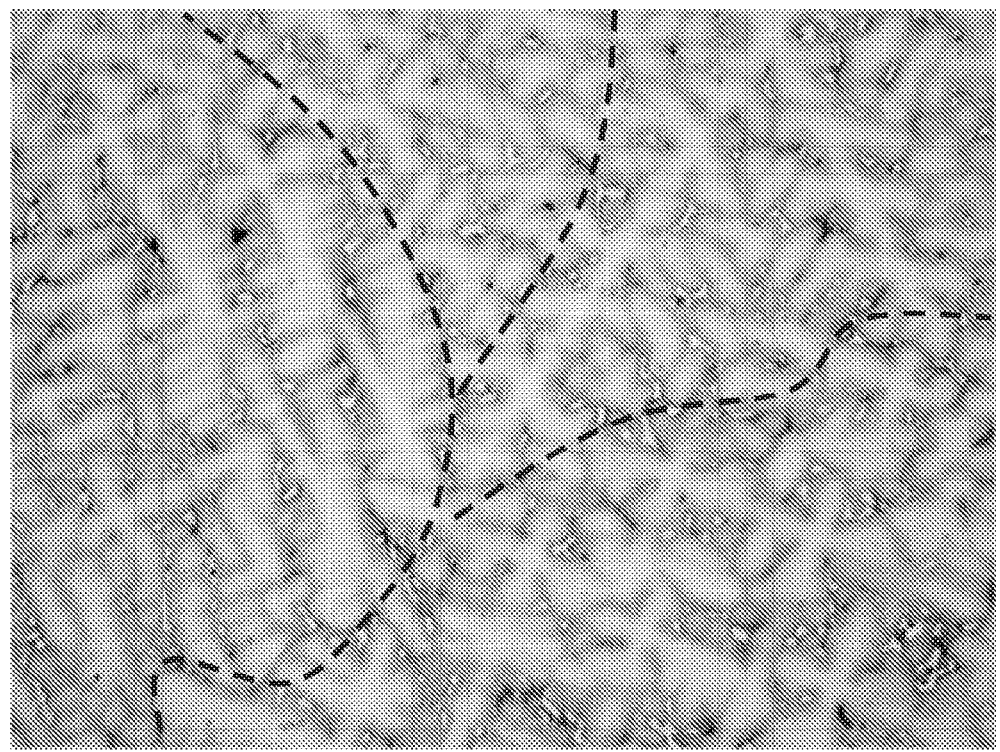
FIGS. 4B, 4D, and 4F show optical microscope images from the associated solidified samples. Note that the top plot and image corresponds to the experiment in which heating and cooling were carried out without application of an external magnetic field for FIGS. 4A and 4B, and with application of an external magnetic field for FIGS. 4C-4F.
Figure 4C:
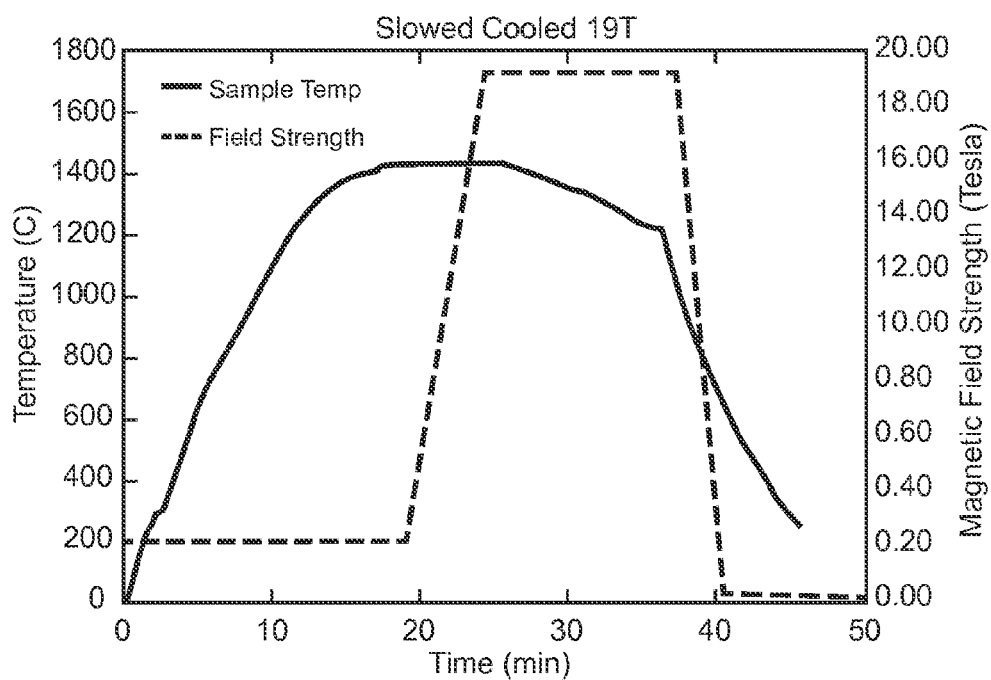
Figure 4D:
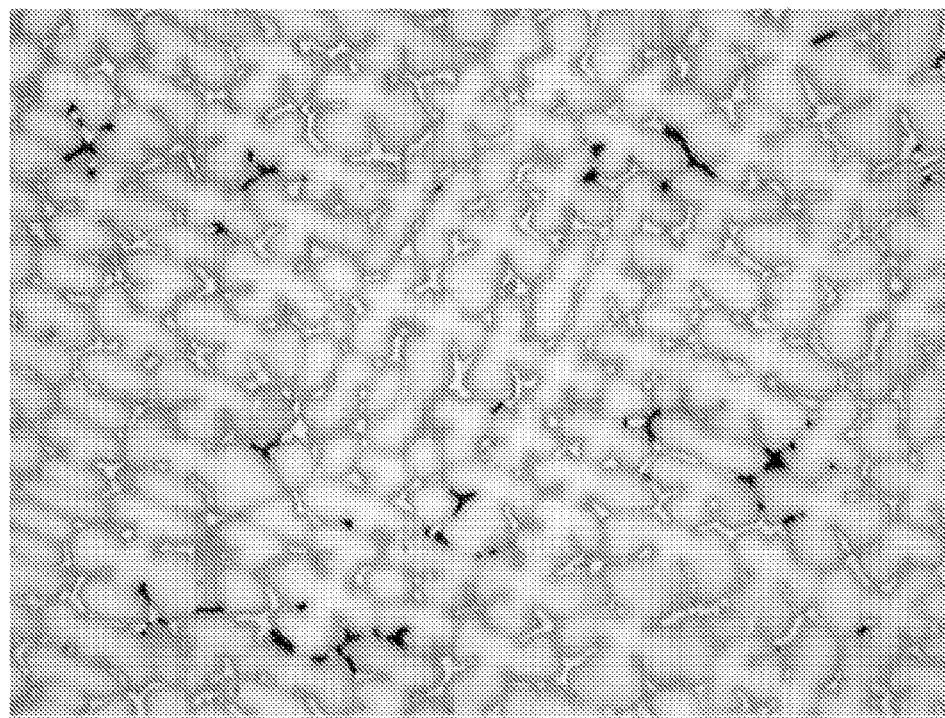
Figure 4E:
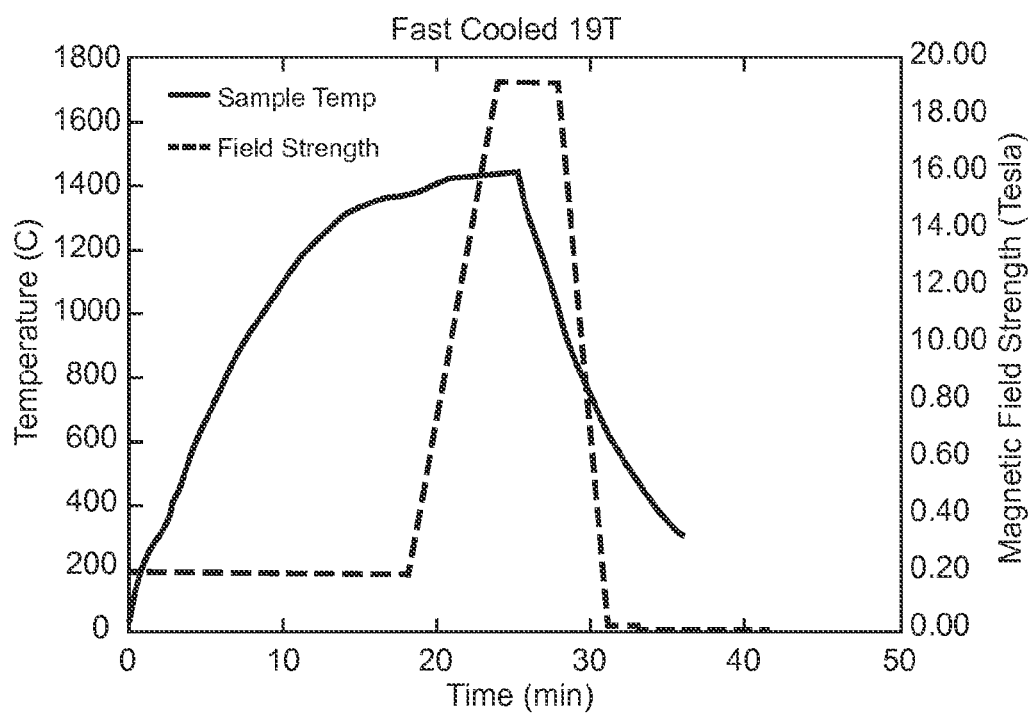
Figure 4F:
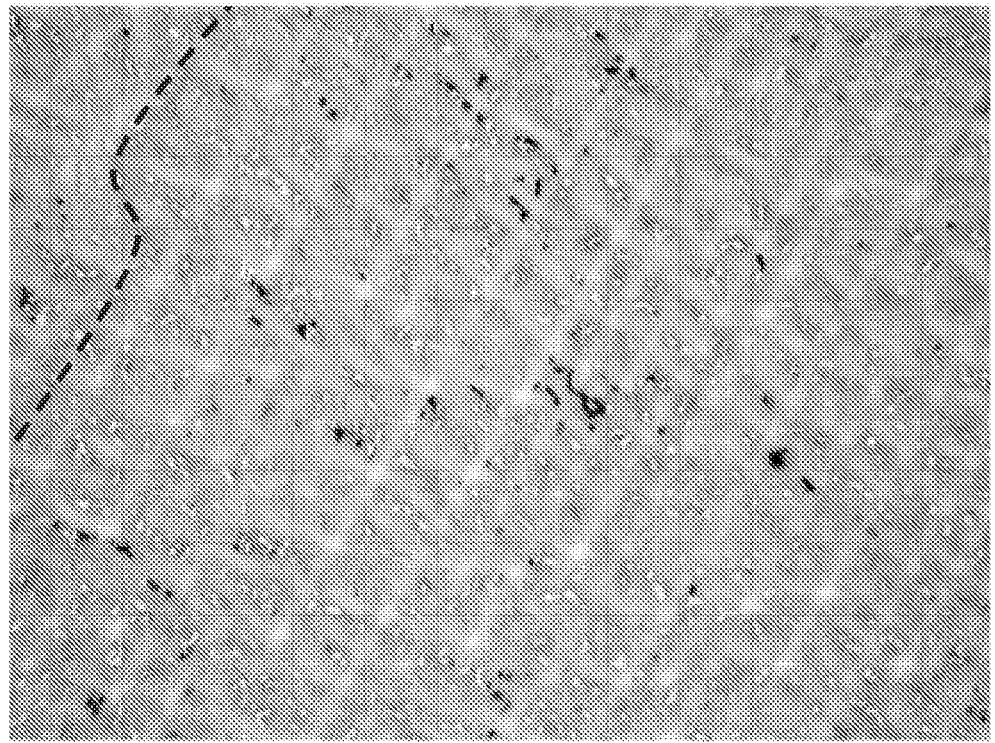

The heating and cooling profiles, as well as the magnetic field profile, are shown in FIGS. 4A, 4C and 4E, along with optical micrographs (FIGS. 4B, 4D, and 4F) showing the microstructure of the thermomagnetically solidified samples (FIGS. 4C-4F) and the no-field, slow-cooled sample (FIGS. 4A-4B). The micrographs show the presence or absence of grain boundaries in local regions (approximately 3 mm$^2$) of the specimens. FIG. 4B for the no-field, slow-cooled sample shows the presence of four grains separated by grain boundaries (about 4+). FIG. 4D for the slow-cooled, 19 T field indicates a single-crystalline structure with zero grain boundaries, and FIG. 4F for the rapidly-cooled, 19 T field indicates a nearly single-crystalline structure with one grain boundary.

2. Characterization

Electron backscatter diffraction (EBSD) was used to confirm the crystallographic preferred orientation of the iron alloy samples processed as described above. FIG. 5 graphically shows that the resultant crystal structure after thermomagnetic solidification with rapid cooling emerges as a single grain orientation for the face-centered-cubic (FCC) component. The monochromatic display indicates that a single crystal orientation is present in the sample.

Figure 6A:
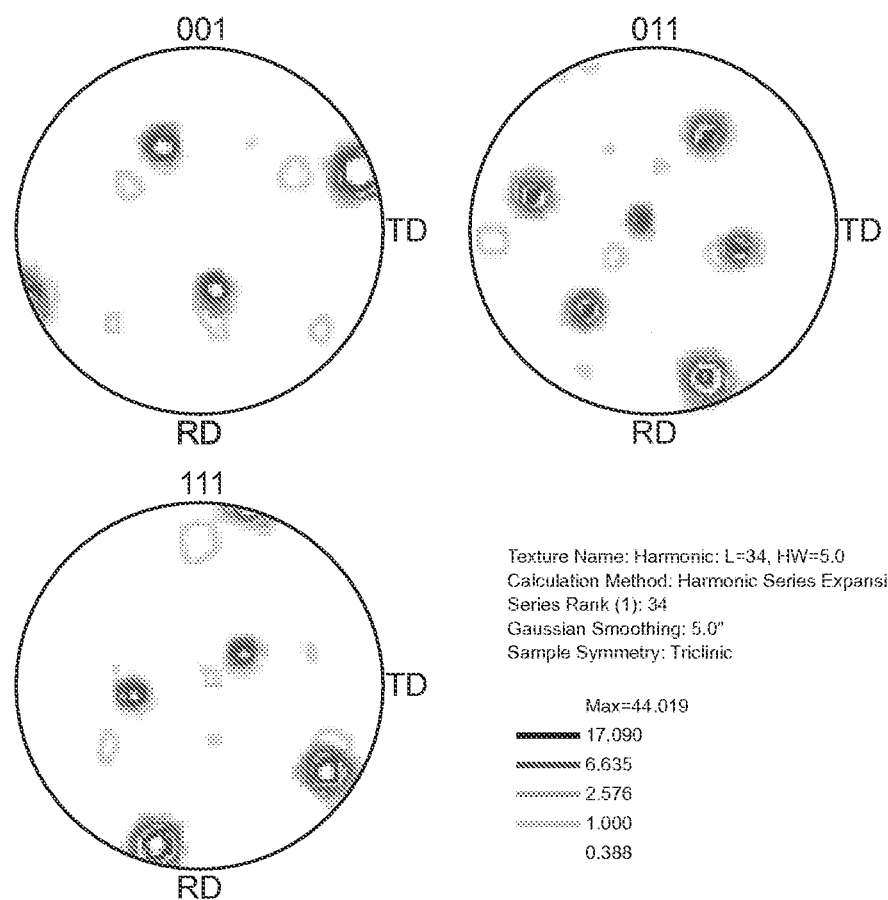
FIGS. 6A-6C show a number of pole figures obtained from three different locations on the slow-cooled (30° C./min) sample. The figures are nearly identical and indicate that the crystallographic plane is uniform.
Figure 6B:
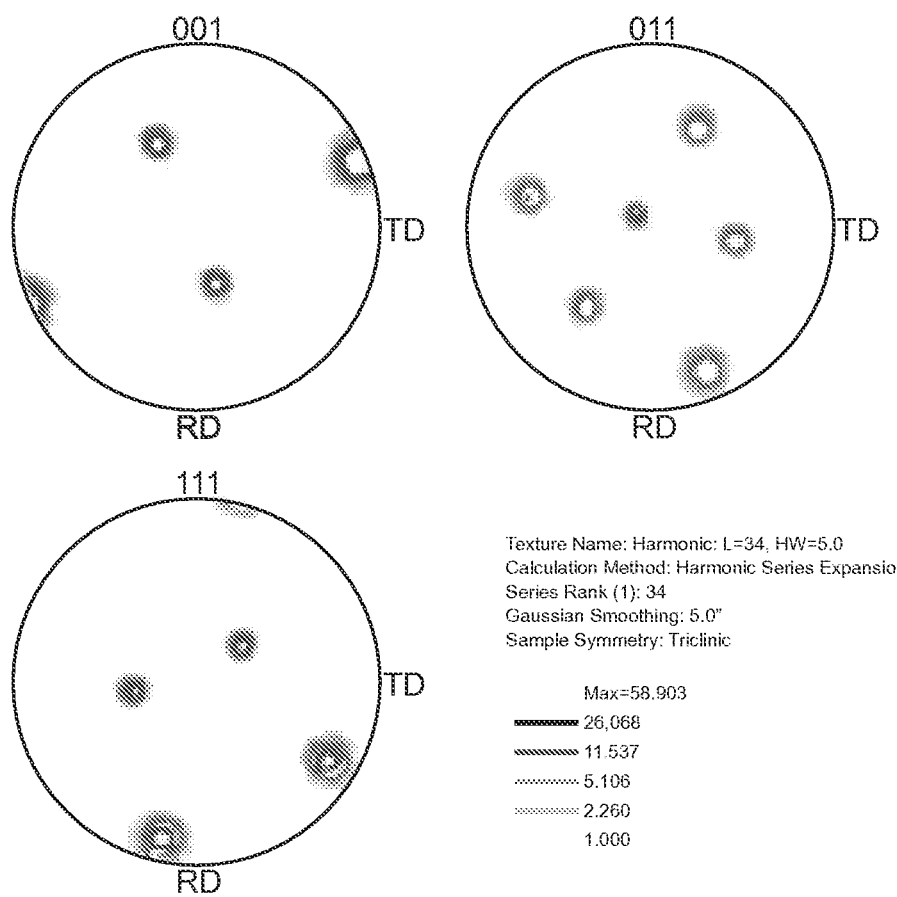
Figure 6C:
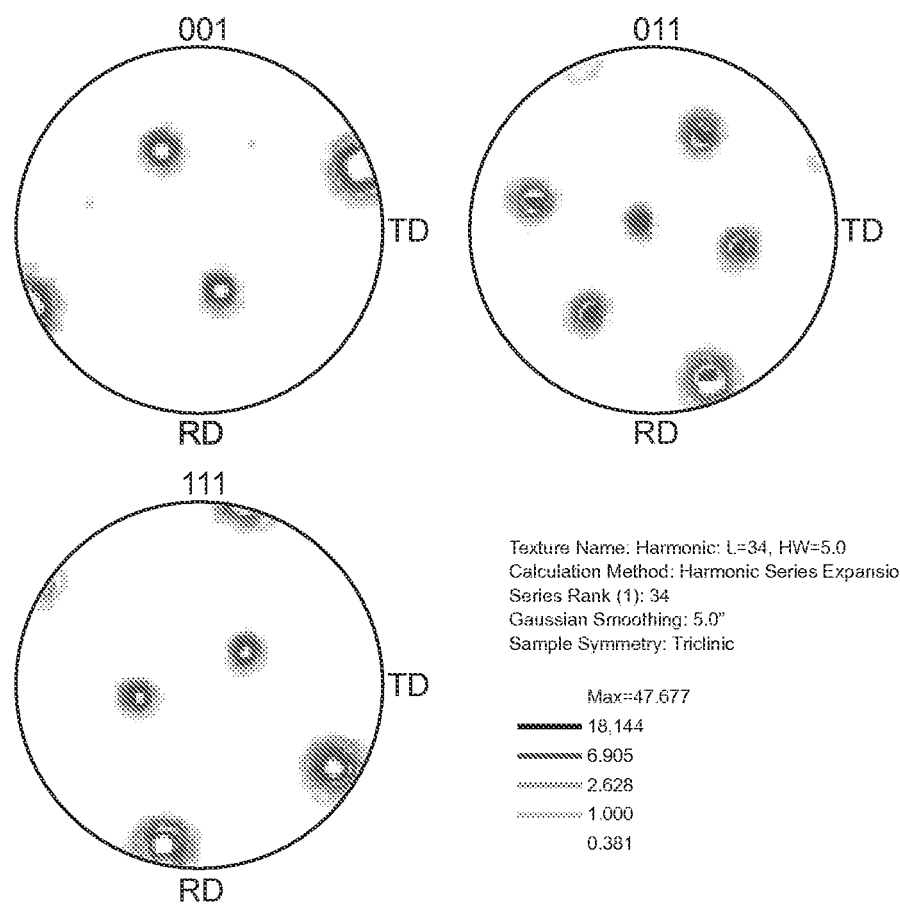

The structure of the resulting crystal may also be represented by pole figures obtained from slow-cooled and fast-cooled samples. FIGS. 6A-6C show pole figures obtained from three different locations on the slow-cooled (30° C./min) sample. FIG. 6B was obtained from a central location of the sample (which is about 1 cm in diameter), and FIGS. 6A and 6C were obtained from locations closer to the sample edge. The three sets of figures are nearly identical and indicate that the crystallographic plane is uniform. The pole figures indicate that there exists a strongly preferred texture for the sample quenched at 30° C./min and having the microstructure shown in FIG. 4B.

Figure 6D:
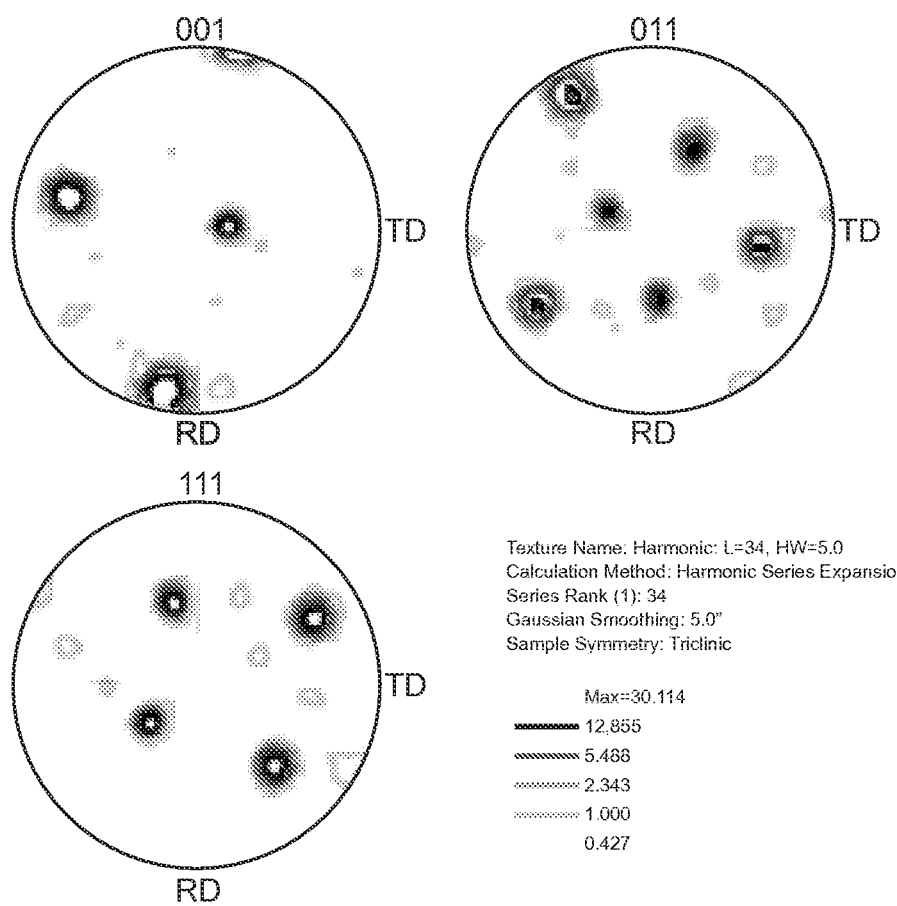
FIGS. 6D-6G show a number of pole figures obtained from four different locations on a fast-cooled (400° C./min) sample of about 1 cm in diameter.
Figure 6E:
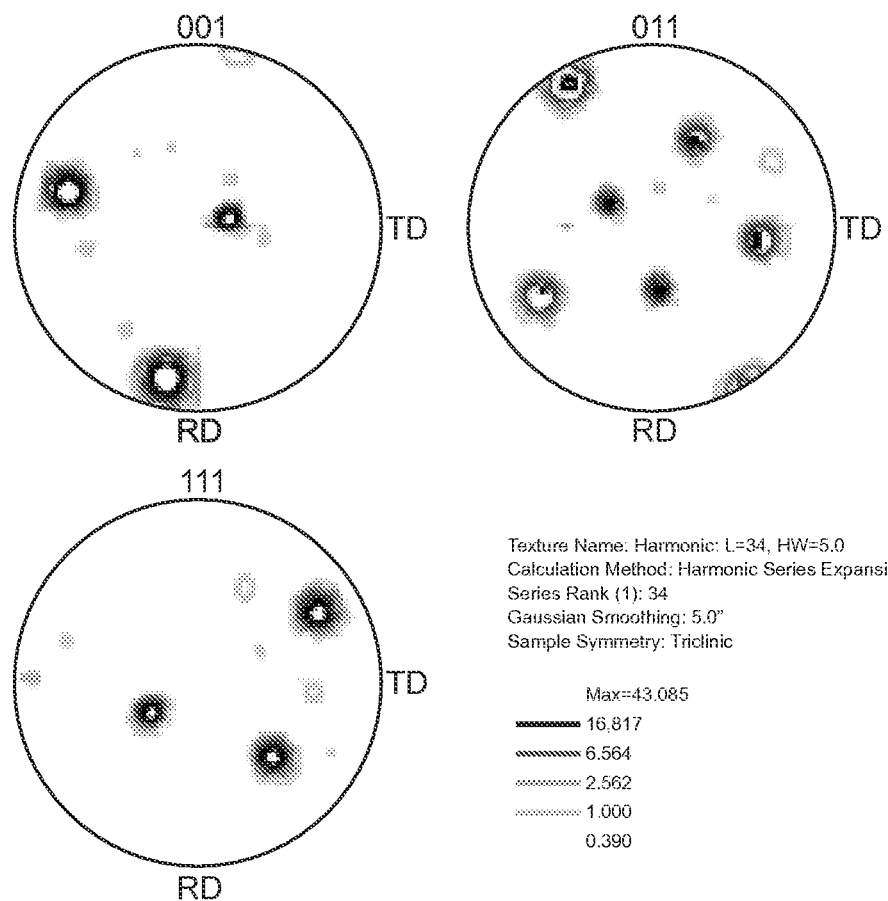
Figure 6F:
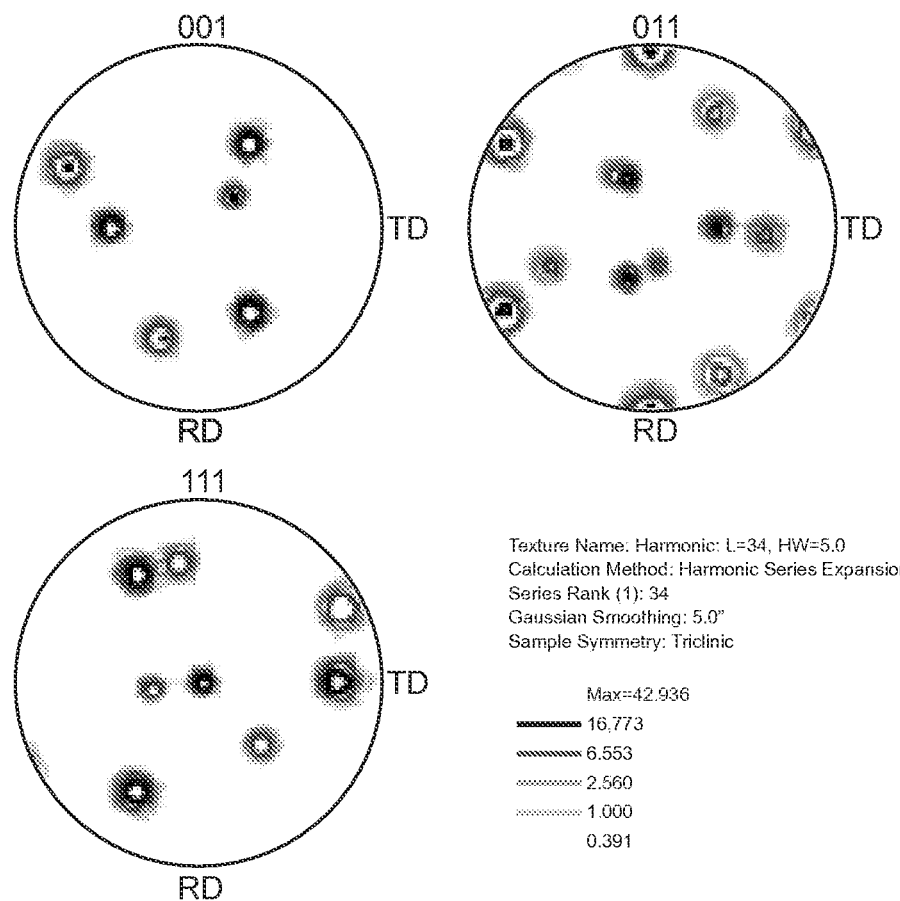
Figure 6G:
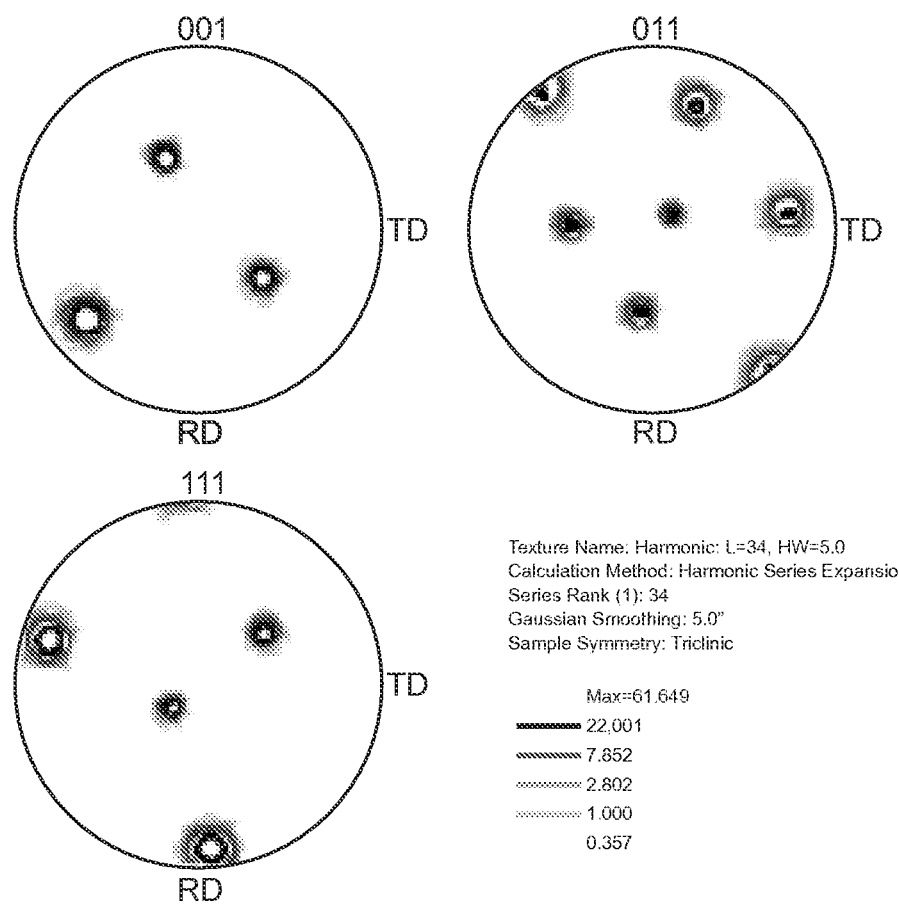

FIGS. 6D-6G show a number of pole figures obtained from four different locations on a fast-cooled (400° C./min) sample of about 1 cm in diameter. FIG. 6E is from a central location and FIGS. 6D, 6F and 6G are from locations closer to the sample edge. These figures suggest that a single crystal orientation may be achieved over at least a portion of the sample.

It is concluded that a single crystal of the iron alloy was formed during solidification in the 19 T magnetic field. Thus, single crystal materials can be formed by cooling in the presence of high magnetic fields.

3. Physical and Magnetic Properties

Figure 7A:
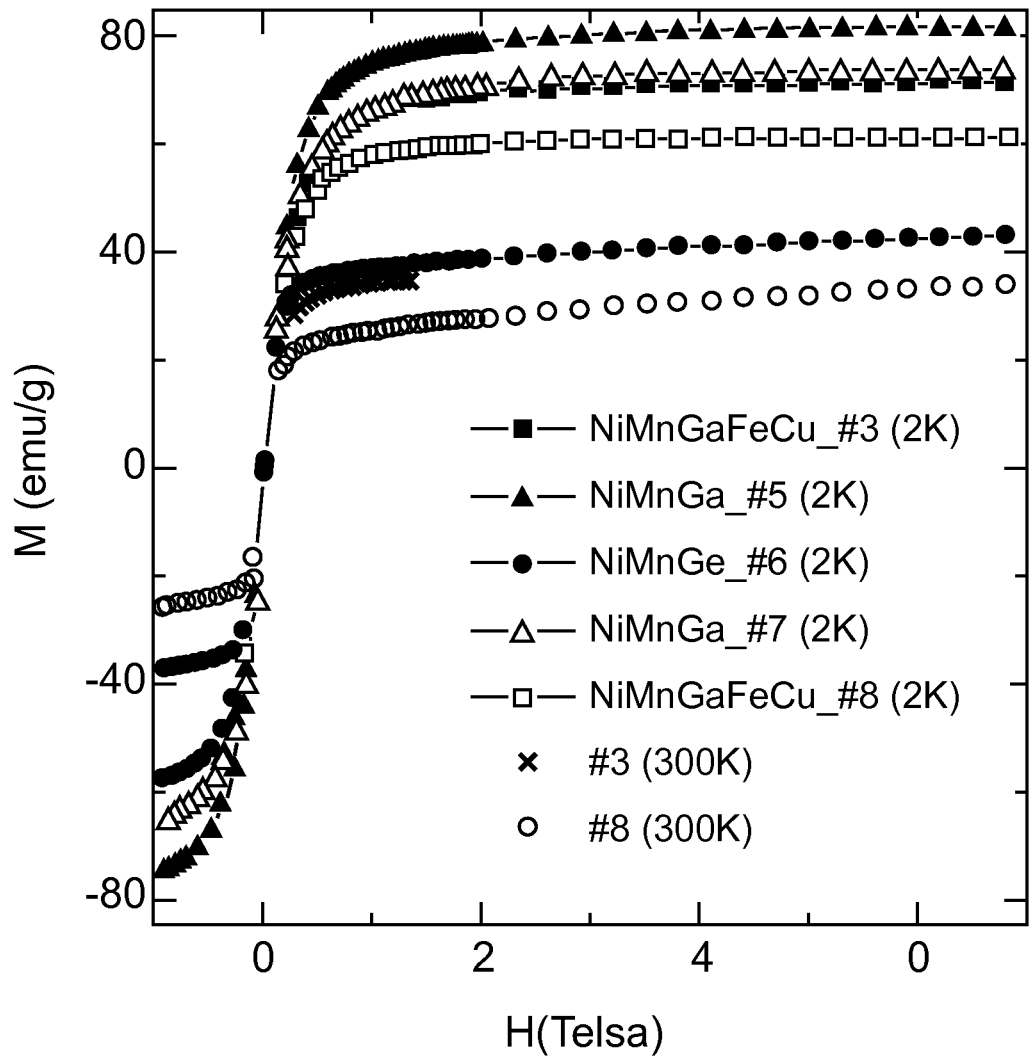
FIG. 7A is a plot showing magnetization curves as a function of field for several MCE alloys.
Figure 7B:
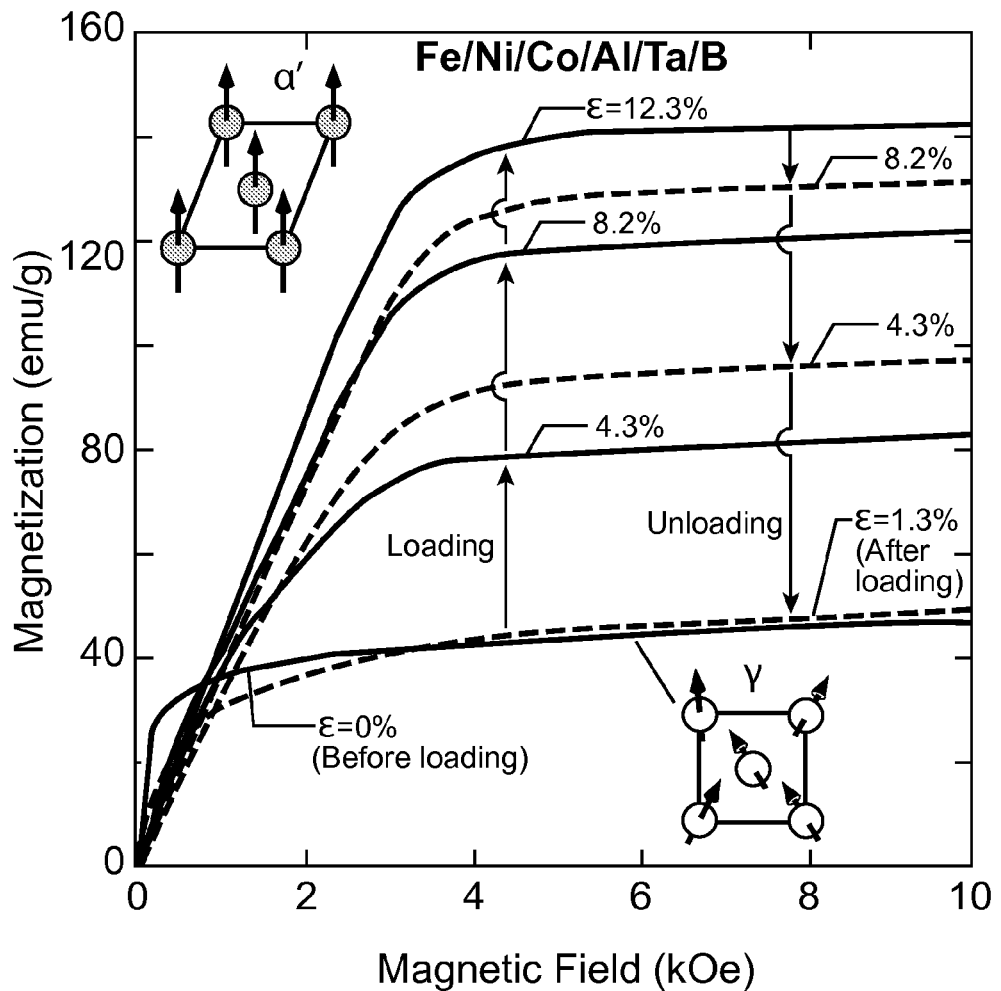
FIG. 7B is a plot showing magnetization curves examined at room temperature under fixed tensile strains for the iron alloy of Example 1, where the solid lines indicate the loading process and the dotted lines indicate the unloading process.

Isothermal magnetization measurements recorded during a magnetic field sweep for several high performance MCE materials are shown in FIG. 7A. A comparison of the results for the Fe—Ni—Co—Al—Ta—B alloy and those for the Fe-based SMA (FIG. 7B) reveal that the magnetization of the austenite phase of the Fe—Ni—Co—Al—Ta—B alloy is significantly greater than that of the rare earth containing MCE materials. Additionally, in the Fe-based material, the magnetization of the martensite phase is 350% greater than that of the higher temperature austenite phase. This difference in magnetization is a possible indication of a major change in entropy.

Both magnetic and structural fluctuations contribute to the MCE. Essentially, a "good" MCE material responds strongly to both temperature and magnetic field. Therefore physical property measurements were carried out to determine phase equilibria of both the structural and magnetic transitions.

Figure 8:
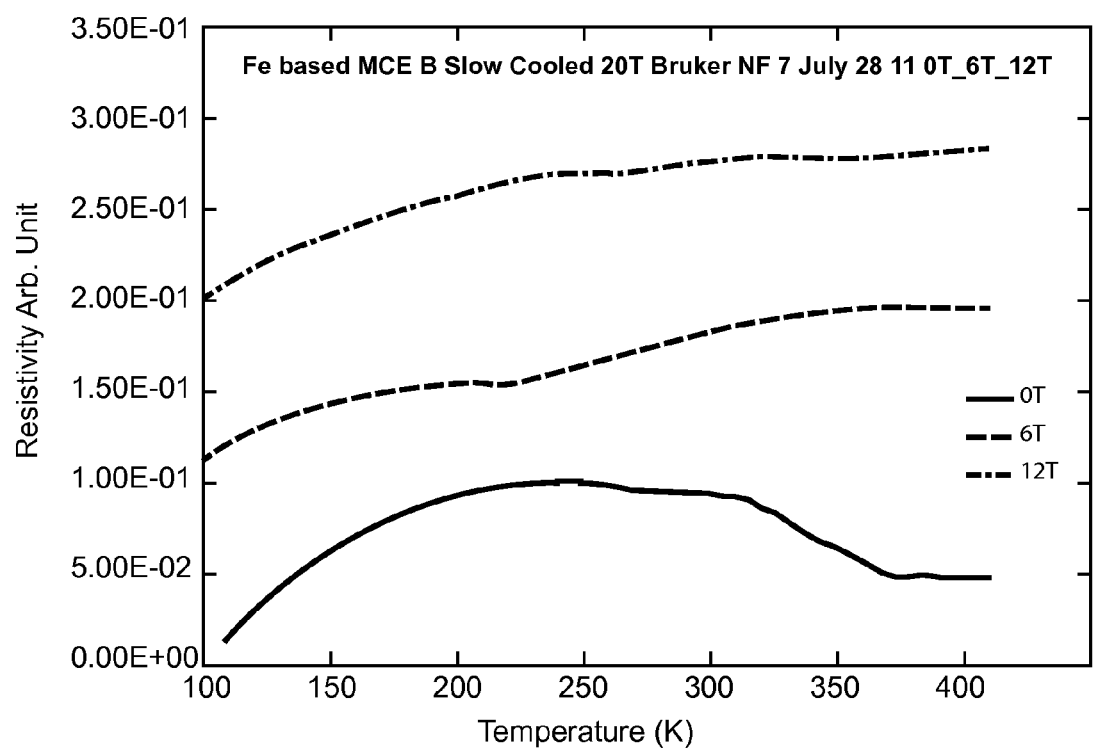
FIG. 8 shows resistivity measurements conducted on the slow-cooled iron alloy of Example 1 at 0, 6 and 12 Tesla showing respective transformation temperatures of 270 K, 216 K and 258 K.

To investigate the MCE, in-situ electrical resistivity experiments on a Bruker 18 Tesla magnet were performed. Select physical property measurements taken on the Bruker magnet at 0, 6 and 12 Tesla and are shown in FIG. 8. A temperature sweep was conducted at each field to identify the transformation temperatures. At 0 Tesla, the transformation temperature was found at approximately 270 K. Increasing the magnetic field to 6 Tesla and 12 Tesla resulted in transformation temperatures of 216 K and 258 K, respectively. For near room temperature cooling applications, ideal MCE materials have a transformation temperature near or slightly below room temperature; therefore, even without further optimization, the Fe—Ni—Co—Al—Ta—B alloy appears to be a good candidate for a rare earth-free MCE material.

Although the present invention has been described in considerable detail with reference to certain embodiments thereof, other embodiments are possible without departing from the present invention. The spirit and scope of the appended claims should not be limited, therefore, to the description of the preferred embodiments included here. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of making a single crystal, the method comprising:
   heating a material comprising magnetic anisotropy to a temperature T sufficient to form a melt of the material;
   applying a magnetic field of at least about 1 Tesla to the melt at the temperature T, where a magnetic free energy difference $\Delta G_m$ between different crystallographic axes of the material is greater than a thermal energy kT;
   while applying the magnetic field, cooling the melt at a rate of about 30° C./min or higher;
   during the cooling, applying an alternating magnetic field at a frequency of from about 10 kHz to about 300 kHz; and
   solidifying the melt to form a single crystal of the material.

2. The method of claim 1, wherein the magnetic field is at least about 5 Tesla.

3. The method of claim 1, wherein the magnetic anisotropy includes at least one member selected from the group consisting of: magnetocrystalline anisotropy and magnetic shape anisotropy.

4. The method of claim 1, wherein the melt is contained in a crucible, and the magnetic field is applied in a direction parallel to a longitudinal axis of the crucible.

5. The method of claim 1, wherein the solidification occurs while the magnetic field is applied.

6. The method of claim 1, wherein the rate of cooling is about 100° C./min or higher.

7. The method of claim 1, wherein cooling the melt comprises extracting heat from the melt in a plurality of directions.

8. The method of claim 7, wherein the plurality of directions extend over an angular range of greater than 180°.

9. The method of claim 1, wherein cooling the melt comprises flowing a thermally conductive gas over the melt.

10. The method of claim 1, wherein, during the solidification of the melt to form the single crystal of the material, one of the crystallographic axes of the material is aligned parallel to a direction of the magnetic field.

11. The method of claim 1, wherein the material is ferromagnetic at room temperature.

12. The method of claim 1, wherein the material is paramagnetic at room temperature.

13. The method of claim 1, wherein the single crystal has a size of at least about 15 cm$^3$.

14. A method of making a single crystal, the method comprising:
   heating a material comprising magnetic anisotropy to a temperature T sufficient to form a melt of the material;
   applying a magnetic field of at least about 1 Tesla to the melt at the temperature T, where a magnetic free energy difference $\Delta G_m$ between different crystallographic axes of the material is eater than a thermal energy kT;
   while applying the magnetic field, cooling the melt at a rate of about 30° C./min or higher; and
   solidifying the melt to form a single crystal of the material, wherein the material comprises:
   25-30 wt. % Ni,
   14-20 wt. % Co,
   9-13 wt. % Al, up to about 3 wt. % Ta,
up to about 0.07 wt. % B; and
the balance Fe.

15. A magnetocaloric device comprising:
an iron-based composition comprising:
25-30 wt. % Ni,
14-20 wt. % Co,
9-13 wt. % Al,
up to about 3 wt. % Ta,
up to about 0.07 wt. % B; and
the balance Fe,
wherein the iron-based composition comprises a crystallite density of no more than about 1 grain/mm$^2$.

16. The magnetocaloric device of claim 15, wherein the iron-based composition comprises:
28 wt. % Ni,
17 wt. % Co,
11.5 wt. % Al,
2.5 wt. % Ta, and
0.05 wt. % B.

17. The magonetocaloric device of claim 15 comprising a single crystal comprising the iron-based composition and having a size of at least about 15 cm$^3$.

18. The magnetocaloric device of claim 15, wherein the iron-based composition comprises a single crystalline structure.

* * * * *

UNITED STATES PATENT AND TRADEMARK OFFICE
CERTIFICATE OF CORRECTION

PATENT NO. : 9,255,343 B2
APPLICATION NO. : 13/790560
DATED : February 9, 2016
INVENTOR(S) : Boyd Mccutchen Evans, III et al.

Page 1 of 1

It is certified that error appears in the above-identified patent and that said Letters Patent is hereby corrected as shown below:

In the Claims

In column 10, claim 14, line 60, after "of the material is" replace "eater" with --greater--.

In column 11, claim 17, line 21, before "device of claim 15" replace "magonetocaloric" with --magnetocaloric--.

Signed and Sealed this
Sixteenth Day of August, 2016

Michelle K. Lee
*Director of the United States Patent and Trademark Office*